United States Patent
Ovsiannikov et al.

(10) Patent No.: US 8,569,681 B2
(45) Date of Patent: Oct. 29, 2013

(54) AMBIENT INFRARED DETECTION IN SOLID STATE SENSORS

(75) Inventors: Ilia Ovsiannikov, Studio City, CA (US); Xuemei Zhang, Mountain View, CA (US); Dmitri Jerdev, South Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 810 days.

(21) Appl. No.: 12/813,705

(22) Filed: Jun. 11, 2010

(65) Prior Publication Data

US 2010/0243899 A1 Sep. 30, 2010

Related U.S. Application Data

(62) Division of application No. 11/513,582, filed on Aug. 31, 2006, now Pat. No. 7,737,394.

(51) Int. Cl.
*G03B 13/02* (2006.01)

(52) U.S. Cl.
USPC .......................................... 250/226; 250/332

(58) Field of Classification Search
USPC ............... 250/226, 214 AL, 214 B, 332, 339; 257/440; 348/272; 356/402, 419
See application file for complete search history.

(56) References Cited

U.S. PATENT DOCUMENTS

| | | | |
|---|---|---|---|
| 4,939,561 A | 7/1990 | Yamaka et al. | |
| 5,095,211 A | 3/1992 | Kimata | |
| 5,294,198 A * | 3/1994 | Schlagheck | 374/4 |
| 6,163,061 A | 12/2000 | Iida | |
| 6,476,455 B2 | 11/2002 | Toyoda et al. | |
| 6,518,597 B1 | 2/2003 | Kim | |
| 6,599,771 B2 | 7/2003 | Mashio et al. | |
| 6,759,657 B2 | 7/2004 | Iida et al. | |
| 6,770,881 B2 | 8/2004 | Iida et al. | |
| 6,793,389 B2 | 9/2004 | Chavan et al. | |
| 6,818,962 B2 | 11/2004 | Yamamoto | |
| 7,170,046 B2 | 1/2007 | Higashitsutsumi | |
| 2004/0101296 A1* | 5/2004 | Nakata et al. | 396/65 |
| 2005/0030401 A1 | 2/2005 | Ovsiannikov et al. | |
| 2006/0033005 A1 | 2/2006 | Jerdev et al. | |
| 2009/0054785 A1* | 2/2009 | Weng et al. | 600/474 |
| 2009/0185809 A1* | 7/2009 | Grace | 398/135 |

* cited by examiner

*Primary Examiner* — Seung C Sohn
(74) *Attorney, Agent, or Firm* — Leffert Jay & Polglaze, P.A.

(57) ABSTRACT

A solid state imaging device includes an array of active pixels and an infrared cut filter formed over the sensor. Optionally, a slot in the infrared cut filter allows infrared illumination to reach the sensor to be detected by pixels covered by a visually opaque filter and surrounded by pixels of special types that limit charge leakage and enable high dynamic range sensing of infrared illumination. A ratio of average infrared signal to average brightness indicates an amount of infrared illumination reaching the imaging device.

20 Claims, 5 Drawing Sheets

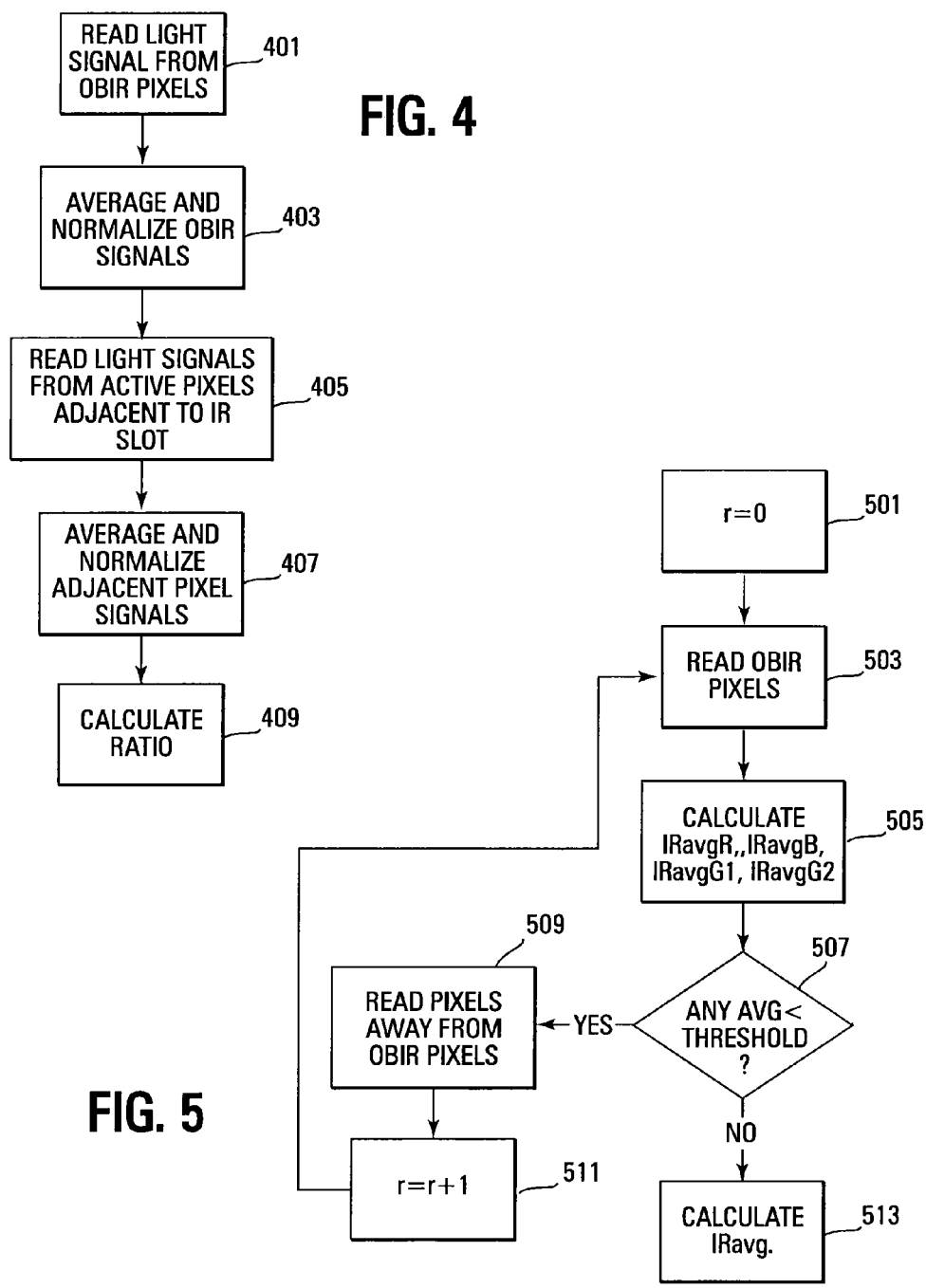

AMBIENT INFRARED DETECTION IN SOLID STATE SENSORS

RELATED APPLICATION

This is a divisional application of application Ser. No. 11/513,582, titled "AMBIENT INFRARED DETECTION IN SOLID STATE SENSORS," filed Aug. 31, 2006 now U.S. Pat. No. 7,737,394 (allowed), which application is assigned to the assignee of the present invention and the entire contents of which are incorporated herein by reference.

TECHNICAL FIELD

The present invention relates generally to optical devices and in particular the present invention relates to image sensors.

BACKGROUND

Image sensors are used in many different types of electronic devices to capture an image. For example, consumer devices such as video cameras and digital cameras as well as numerous scientific applications use image sensors to capture an image. An image sensor is comprised of photosensitive elements that sense incident illumination and produces an electrical signal indicative of that illumination. Each photosensitive element is typically referred to as a picture element or pixel.

Image sensors include charge coupled devices (CCD) and complementary metal oxide semiconductor (CMOS) sensors. Imaging sensors may be capable of capturing grayscale and/or color images. Imaging sensors capable of capturing color images often employ a color filter array (CFA) to separate visible illumination of different color. For example, each of the pixels can be covered with a red, green, or blue filter according to a specific pattern. For example, the Bayer pattern has a repeating pattern of an alternating row of green and red and an alternating row of blue and green. As a result of the filtering, each pixel of the color image captured by a CMOS sensor with CFA responds to only the illumination of wavelengths determined by the color filter of the three primary light colors.

CFA color filters are typically transparent to infrared illumination. In video and still digital cameras, an infrared-cutoff filter is typically placed in front of the sensor to ensure that only visible wavelength illumination reaches the sensor. This is done to make possible accurate color reproduction in captured images.

White balance is the compensation of an image for variation in color temperature of scene illuminant. Images are adjusted in such a way that gray objects will look gray when displayed on a standard output device with a predefined color temperature. Other colors displayed on the output device will also appear as they appeared during image capture. Without white balance, images captured using illuminants having a low temperature will exhibit a reddish cast when displayed on a standard RGB monitor with the color temperature of the white point of 6500K. Illuminants of higher color temperature can create a bluish cast. The human eye can compensate for the different color temperatures. Both film and digital cameras, however, need to correct for different light sources in order to render an image in its true colors.

In a film camera, the color correction can be accomplished manually by the camera user attaching a color correction filter over the lens. A digital camera can correct the color temperature automatically by estimating the color temperature of the scene illuminant. Then the entire image is adjusted by the difference between the scene illuminant color temperature and the color temperature of the white point of the target output device (e.g., a standard display). One problem with this approach is that the white balance algorithm has to be informed as to the correct color temperature of the scene illuminant.

Various techniques exist in the art to determine the color temperature and spectral content of the illuminant. The color temperature of the illuminant can be reliably identified if one knows which objects in the scene are white. Determining the current lighting conditions in a digital camera may be difficult since cameras cannot reliably automatically identify which objects in the scene are white and which are not and thus must rely on other estimation techniques. However, illumination sources often vary with respect to how much infrared radiation they emit. Having an estimate of how much infrared radiation is present in the scene compared to visible illumination can provide information about the nature of the illuminant. For example, incandescent lamps emit visible light accompanied with strong infrared content. Office fluorescent lighting typically emits very little infrared when compared to scene luminance. Outdoor daylight contains moderate amounts of infrared compared to scene luminance. For the reasons stated above, and for other reasons stated below which will become apparent to those skilled in the art upon reading and understanding the present specification, there is a need in the art for detecting ambient infrared in a sensor equipped with an IR cut-off filter.

BRIEF DESCRIPTION OF THE DRAWINGS

FIG. 4 shows a flowchart of one embodiment of an IR sensing method.

FIG. 5 shows a flowchart of one embodiment for determining $IR_{avg}$.

DETAILED DESCRIPTION

Figure 1:
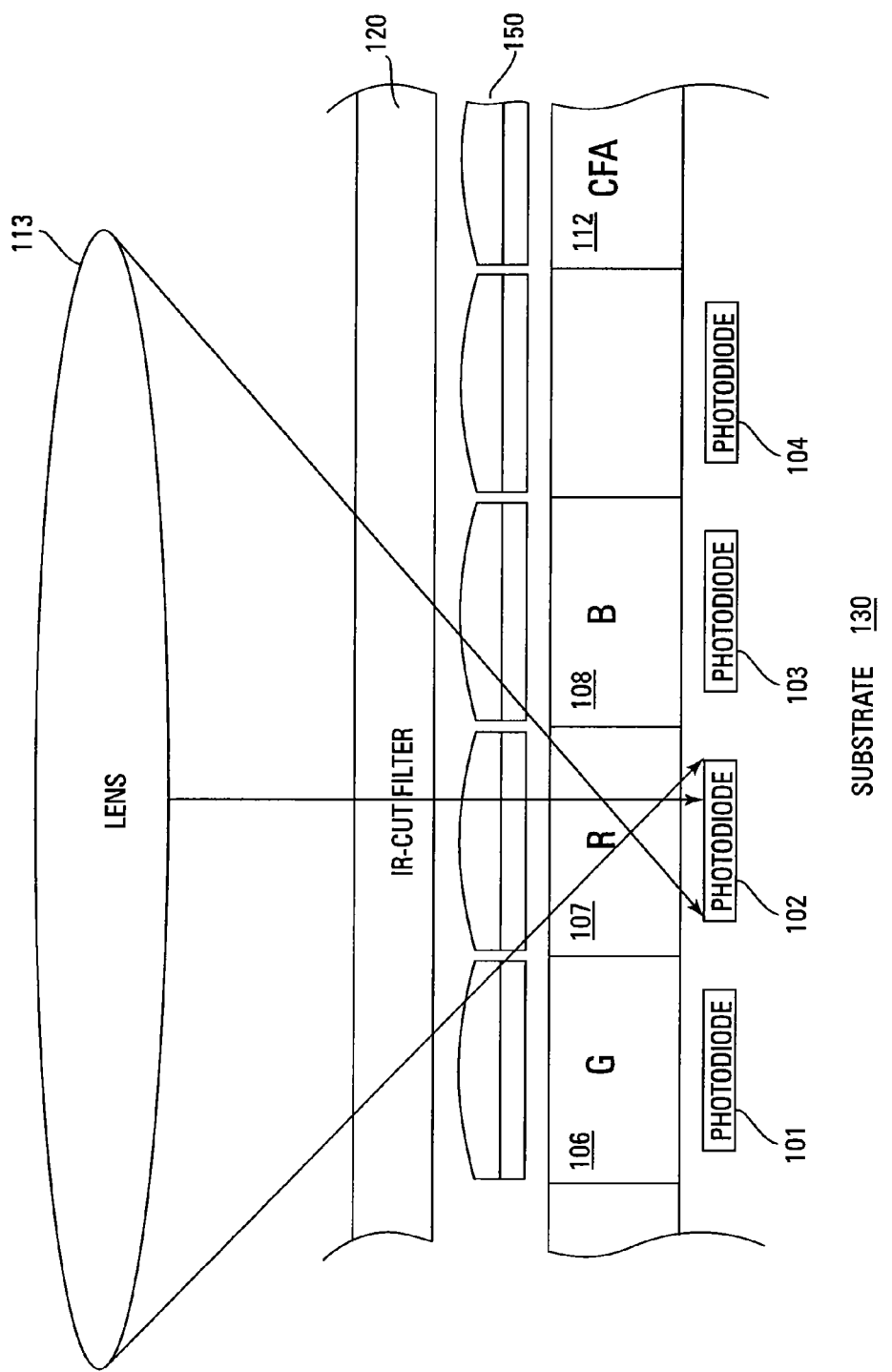
FIG. 1 shows a cross-sectional view of one embodiment of a portion of an image sensor.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of one embodiment of an image sensor. For purposes of clarity, not all of the layers are shown in this figure. For example, there may be metal interconnect layers formed between the layers shown as well as dielectric layers for insulation purposes.

The sensor is comprised of a substrate 130 that incorporates a plurality of pixels or photodiodes 101-104. The photodiodes 101-104 are responsible for converting light into an electrical signal for use by the circuitry that reads the photodiode information. The higher the intensity of the light that strikes the photodiode 101-104, the greater the charge collected.

Optionally, a color filter array (CFA) 112 is positioned over the photodiodes 101-104. This layer comprises the different color filters required for the color system that is used. For example, the filters may be red 107, green 106, and blue 108 for an additive RGB system or cyan, yellow, magenta, and an extra green for a subtractive CYMG system. Each filter color separates out that particular color for that photodiode. In one embodiment, the color filters are formed in a "Bayer" color filter pattern that is well known in the art.

Figure 3:
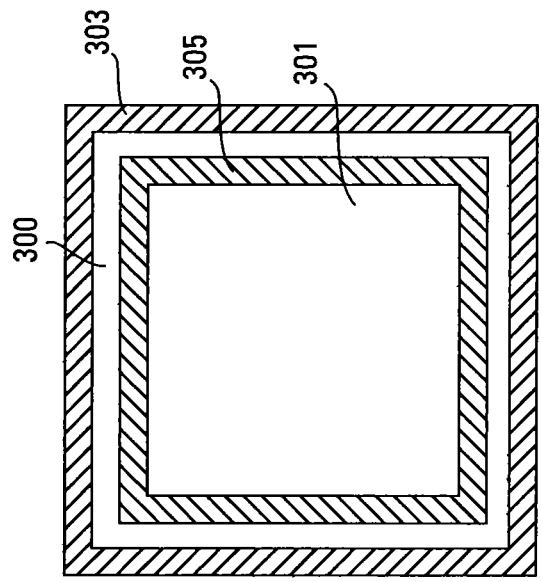
FIG. 3 shows a top view of the image sensor that is beneath the infrared filter.

An IR cutoff filter 120 is positioned over the CFA 112. This filter blocks IR light from reaching certain ones of the photodiodes 101-104 such that only visible light reaches the desired photodiodes 101-104. A top view of the embodiments of the IR cutoff filter 120 of the present invention are illustrated in FIGS. 2 and 3 that are described subsequently.

A lens 113 is positioned over the IR cutoff filter 120. The lens 113 is responsible for focusing light on the photodiodes 101-104.

Optionally, a plurality of micro-lenses 150 can be formed over the photodiodes 101-104. Each micro-lens 150 can be formed over a corresponding photodiode 101-103. Each micro-lens 150 focuses the incoming light rays onto its respective photodiode 101-104 in order to increase the light gathering efficiency of the photodiode 101-104.

Figure 2:
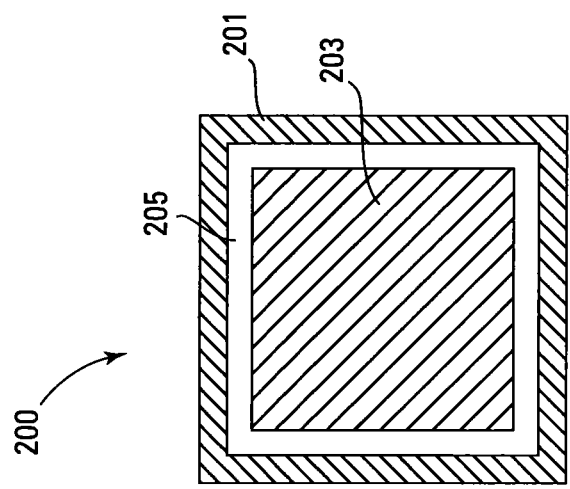
FIG. 2 shows a top view of one embodiment of an image sensor.

FIG. 2 illustrates a top view of one embodiment of the IR cutoff filter 203 over an image sensor. In this embodiment, the IR filter 203 is deposited directly on the sensor 200 or its protective cover in a patterned fashion. The active array pixel filter 203 blocks IR from reaching the active pixel array under the filter 203. A slot 205 is formed in the periphery of the filter 203 over the array to allow IR to reach the pixels under the slot 205. Optically "black" IR-sensitive (OBIR) pixels 300 as shown in FIG. 3 are formed around the periphery of the sensor 200. The OBIR pixels 300 are covered with a filter that blocks all visible wavelengths of light from hitting the pixels but is transparent to IR illumination.

The slot 205 of FIG. 2 is only one embodiment of the IR cutoff filter. The opening or openings in the IR filter can be of any shape that can be formed into the filter, thus exposing a predetermined quantity of pixels to IR illumination. For example, a slot can be positioned along only one side of the sensor.

FIG. 3 illustrates the composition of the sensor pixel array lying directly beneath the IR filter. This figure shows the regular active array of pixels 301 that is covered by an IR cutoff filter. This array 301 is surrounded by a ring of OBIR pixels 300 that must be under the opening in the IR filter. The OBIR pixels 300 are separated from the active pixel array 301 by a ring of barrier pixels 305. The barrier pixels 305 shield the active pixel array 301 from IR leaking into periphery active pixels in the active array 301 due to the long wavelength of IR. The barrier pixels 305 may be shielded from both visible and IR illumination (using a metal layer) and also act to substantially stop any charge leakage from the OBIR pixels 300 into the active pixels 301. This avoids contaminating the response of active pixels by IR generated charge.

The OBIR pixels 300 are the same type of pixels that are illustrated in FIG. 1 but are not covered by the IR cutoff filter as is the active array of pixels 301. This allows the OBIR pixels 300 to receive IR illumination.

FIG. 3 also includes optically and IR black (OIRB) pixels 303 that are shielded from all light, both visible and IR. This can be accomplished by a metal layer. These pixels 303 may or may not be under the slot in the IR filter. The active pixel array 301 is covered with the patterned array of color filters (e.g., Bayer CFA).

FIG. 4 illustrates a flowchart of one embodiment of a method for IR detection in accordance with the image sensors of FIGS. 2 and 3. This method reads the light signal from the OBIR pixels 401. These signals are averaged and normalized by analog gain 403 to obtain $IR_{avg}$ as described later with reference to FIG. 5.

After the averaging and normalization of the OBIR signals 403, the light signals from the active pixels adjacent to the IR slot shown in FIG. 3 are analyzed 405. These signals are averaged and normalized 407 by analog gains to generate $G_{avg}$. $G_{avg}$ is then used to calculate the ratio 409 of $G_{avg}/R_{avg}$.

Averaging the signals is accomplished by the equation:

$$G_{avg} = (avg(P_{ij} \text{green1})/GainG1 + avg(P_{ij} \text{green2})/GainG2)/2/T_{int\ activepixels} \quad (1)$$

where '$P_{ij}$ green1' is a light signal from a pixel located in row i and column j in the sensor array, covered by a green CFA filter and located in such rows i that contain pixels covered with green and red CFA filters, '$P_{ij}$ green2' is a light signal from a pixel located in row i and column j in the sensor array, covered by a green CFA filter and located in such rows i that contain pixels covered with green and blue CFA filters, 'GainG1' is the gain applied to the green1 pixels, 'GainG2' is the gain applied to the green2 pixels, and '$T_{int\ activepixels}$' is the integration time the active pixels are receiving.

During a normalization process, GainR, GainB, GainG1, and GainG2 for the Bayer pattern are the four typical gains of an image sensor. The gains are applied to corresponding pixels in the Bayer pattern. Since OBIR pixels may only differ from regular pixels by having a black filter, the red, green 1, green2, and blue pixel gains keep getting applied to OBIR pixels as well in order to simplify sensor design.

Referring again to FIG. 4, after the averaging and normalizing of the OBIR signals 403, the light signals from the active pixels adjacent to the IR slot shown in FIG. 3 are analyzed 405. These signals are then averaged and normalized 407 by analog gain to generate $G_{avg}$. $IR_{avg}$ is discussed subsequently with reference to FIG. 5. $IR_{avg}$ is then used to calculate the ratio 409 of $G_{avg}/IR_{avg}$. Alternate embodiments can calculate other ratios such as $Y_{avg}/IR_{avg}$ where $Y_{avg}$ is the average luminance of pixels after demosaicing and, optionally, color correction.

FIG. 5 illustrates a flowchart of one embodiment for determining $IR_{avg}$. The method begins with zeroing a row counter, r 501. The signals from the OBIR pixels are then read 503. These signals are used to determine four averages of $P_{ij}$ from the OBIR pixels and are affected by Blue/Red/Green1/Green2 gain. These averages are denoted as $IR_{avgR}$, $IR_{avgB}$, $IR_{avgG}$.

$IR_{avgG}$, $IR_{avgB}$ and $IR_{avgR}$ are calculated as follows.

$$IR_{avgG}(r) = avg(avg(P_{ij} \text{green1})/GainG1, avg(P_{ij} \text{green2})/GainG2)/T_{int\ IR} \quad (2)$$

$$IR_{avgR}(r) = avg(P_{ij} \text{red})/GainR/T_{int\ IR} \quad (3)$$

$$IR_{avgB}(r) = avg(P_{ij} \text{blue})/GainB/T_{int\ IR} \quad (4)$$

where $P_{ij}$ are OBIR pixels from the $r^{th}$ inner pixel ring as detailed below. $T_{int\ IR}$ is the integration time OBIR and OIRB pixels are receiving, which is typically equal to $T_{int}$ active pixels. If pixel ring r contains no pixels of type green 1 or green2, the corresponding term is excluded from the calculation of the average in (2).

These averages are compared to a saturation threshold 507, $T_{sat}$. This threshold is determined by the maximum pixel value $D_{max}$ that can be read multiplied by a saturation constant, $K_{sat}$ (i.e., $T_{sat}=K_{sat}*D_{max}$). For example, a maximum pixel value of 1023 multiplied by a constant of 18%. If ring r contains no pixels affected by the blue or red gains, the comparison for the average value of that type of pixel is not performed.

Figure 7:
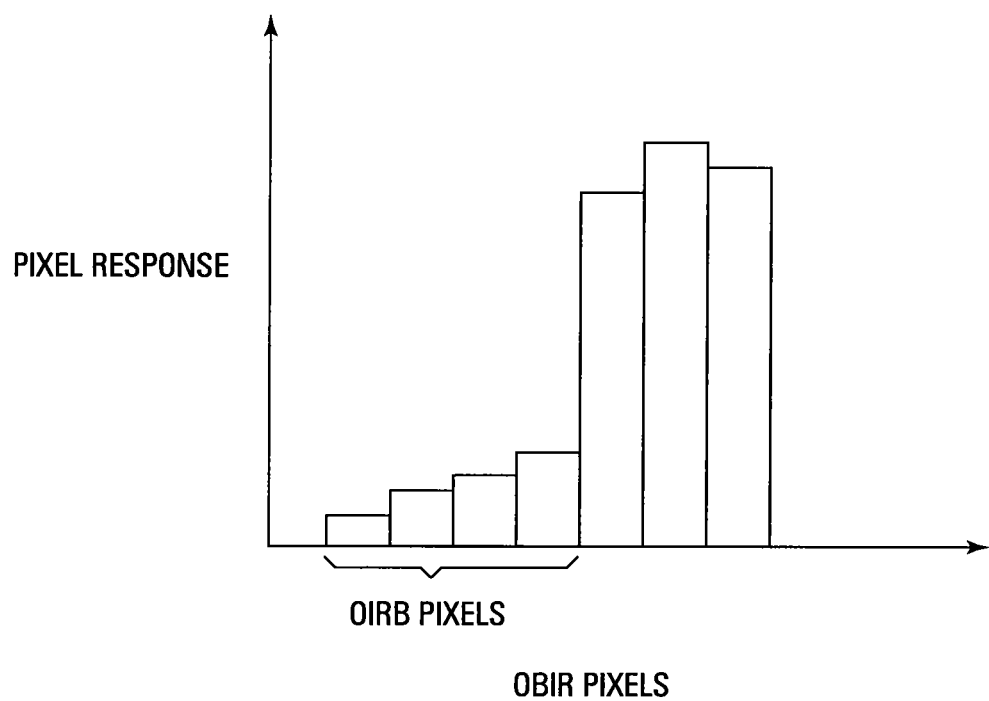
FIG. 7 shows a graph of pixel response for the IR-sensitive and IR-shielded pixels of an image sensor.

If none of the averages are less than $T_{sat}$ 507, the pixels being considered are all close to IR saturation. Therefore, "more inner" OIRB pixels that are further from the OBIR pixels are then read 509. The "more inner" OIRB pixels are read by incrementing the row counter 511 and repeating the OBIR pixel read 503. This is repeated until non-saturated pixels are found. Since these pixels are shielded from visible and IR illumination, the signal generated by these pixels is due largely to charge and light leakage from adjacent OBIR pixels, see FIG. 7. Hence such signal may be substantially attenuated compared to OBIR pixel response thus allowing to assess IR illumination even when OBIR pixels are overexposed.

Charge leakage is the result of the fact that infrared photons are absorbed at a higher depth than the visual wavelength photons due to solid state sensor construction typically having a longer average travel distance before the infrared photo-generated carriers are collected. Thus, the infrared-generated carriers can leak under the optical shield of the OIRB pixels. The OIRB pixels collect the infrared-generated charge and their response is increased. Illumination free of infrared will have no effect on OIRB pixel response. The magnitude of that component can then be determined in comparison to the visible light illumination of the edge pixels.

OIRB pixels are particularly effective in cases where levels of IR radiation are so high as to saturate responses of OBIR pixels. For example, as the image sensor operates, the exposure for active pixels is typically selected to result in capture of visually pleasing images. Since OBIR pixels differ from active pixels only by having a different CFA filter, their exposure would typically be identical to that of the active pixels. This is true unless, optionally, the sensor is specifically designed to allow setting exposure of OBIR pixels independently from active pixels. In such an embodiment, the sensor would require a more complicated design.

When active pixels are exposed in a way optimal for image capture, OBIR pixel response can be saturated if the scene illuminant has a high IR content. In such case, values of OIRB pixels should be read out instead of OBIR.

After non-saturated pixels are found, the average of the averages that are less than the saturation threshold $T_{sat}$ is determined 513. This is determined by the following equation where, typically, $T_{intIR}=T_{intactivepixels}$ and $K_{ir}$ is an IR sensitivity coefficient:

$$IR_{avg}(r)=avg(IR_{avgR}(r), IR_{avgB}(r), IR_{avgG}(r))/K_{ir}(r) \quad (5)$$

In the formula above, if $IR_{avgR}$, $IR_{avgG}$, and/or $IR_{avgB}$ are less than $T_{sat}$, or pixels of a certain type (e.g., affected by the blue or red gains) do not exist in ring r, these averages are excluded from the average.

If IR coefficient is set to 1 for OBIR, $K_{ir}(0)$ is defined as 1 for OBIR pixels, $K_{ir}(0)=1$. $K_{ir}$ for inner OIRB pixels is typically substantially less than 1. For example, the inner row of OIRB pixels could have $K_{ir}(1)=0.05$. The next row, $K_{ir}(2)$ might have $K_{ir}(2)=0.0025$. The coefficient would get progressively smaller due to reduced sensitivity of inner OIRB pixels. $K_{ir}(r)$ can be determined using a calibration procedure.

One such calibration procedure illuminates the sensor with IR that has spectra expected to be encountered in actual operation. A flat field is then imaged. The sensor exposure and gains are adjusted to make responses of OIRB pixels equal to a constant (e.g., $T_{sat}$). Exposure $T_{int}(r)$ is recorded for r=0, as $T_{int}(0)$. Gains are then frozen. For each inner ring of OIRB pixels, exposure is adjusted to make their responses equal to $T_{sat}$. The OIRB pixels probably saturate in this condition. $T_{int}(r)$ is recorded for r=1, 2, etc. If $K_{ir}(0)=1$, $K_{ir}(r)=T_{int}(0)/T_{int}(r)$.

The embodiment of the sensor of FIGS. 2 and 3 is optimized for use during manufacture of a sensor array. The opening in the IR cutoff filter can be added when the IR filter is formed over the sensor array.

The IR detection embodiments can also be used when a sensor array already has an IR cutoff filter covering the entire array of pixels. Such an IR detection embodiment relies on the fact that spectral transmittance of reflective IR-cutoff filters is highly angle dependent. Such filters allow a small amount of IR illumination through when illuminated at an angle other than perpendicular to the filter plane.

One problem solved by the present embodiments in IR sensing in using a visible light sensor is that the level of IR can substantially differ from the level of visible illumination, sometimes by many orders of magnitude. By using OBIR and OIRB pixels the IR is sensed in a high-dynamic-range fashion. The present embodiments require only a few changes to the sensor such as forming a black filter over some pixels, a metal layer over other pixels, and forming "barrier" pixels.

There are also alternative embodiments for IR sensing. For example, the exposure of IR pixels can be controlled independently from active pixels. In this embodiment, the exposure is varied to avoid overexposure of IR pixels and the OIRB pixels are optional.

In yet another embodiment, the method for IR sensing is similar to the embodiment of FIGS. 2-5 but not all of the OIRB pixels are shielded completely. The pixels adjacent to the OIRB pixels have a certain area (e.g., 50%) covered by metal. The next inner row is covered by metal to a greater extent (e.g., 75%) and the next row is covered to an even greater amount (e.g., 100%).

In still another embodiment, the OIRB pixels are not used. In this embodiment, special high dynamic range pixels are used to sense IR.

Figure 6:
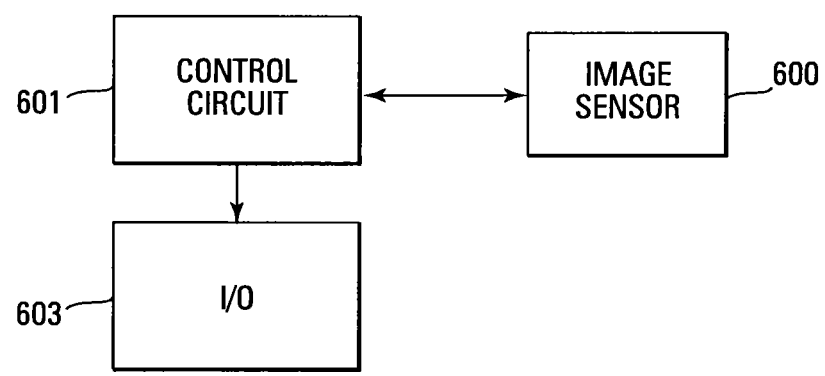
FIG. 6 shows a block diagram of one embodiment of an imaging system of the present invention.

FIG. 6 illustrates a block diagram of one embodiment of an imaging system of the present invention. The system comprises an image sensor 600 as described previously, coupled to a control circuit 601. This system can represent a camera or some other imaging device.

In one embodiment, the control circuit 601 is a processor, microprocessor, or other controller circuitry that reads and processes the image from the image sensor device 600. For example, the imaging system can be a digital camera in which the image sensor device 600 is exposed to an image for recording. The control circuitry 601 executes the above-described embodiments and reads the accumulated charges from the photodiodes of the image sensor device 600. The control circuitry 601 may then process this data into an image or simply store the data.

The data from the system can be output to other systems over an I/O circuit 603. The I/O circuit 603 may be a Universal Serial Bus (USB) or some other type of bus that can connect the imaging system to a computer or other system.

CONCLUSION

In summary, the embodiments discussed herein provide a way to measure the amount of infrared illumination that reaches an image sensor. Knowing the amount of infrared illumination is useful in automatic white balance algorithms. A large amount of infrared illumination informs the white balance algorithm that the scene is illuminated by an incandescent light source. The white balance algorithm can then shift the color temperature of the received image to adjust for the extra red color cast. A low amount of infrared informs the white balance algorithm that the camera is imaging a scene illuminated by a fluorescent light source, such as office lighting, and the color temperature of the received image must be shifted to remove a greenish cast. A moderate amount of infrared indicates that the camera is used outdoors in daylight conditions. In this condition, the white balance would typically remove a blue color cast from the image, if any.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for detecting infrared light on a semiconductor image sensor, the method comprising:
   reading a plurality of IR light signals from a plurality of optically black IR sensitive pixels;
   generating an average IR signal by averaging the plurality of IR light signals with an analog gain;
   normalizing the average IR signal;
   reading a plurality of non-IR light signals from pixels shielded with an infrared filter;
   generating an average non-IR signal by averaging the plurality of non-IR light signals with an analog gain;
   normalizing the average non-IR signal; and
   generating a ratio of the average IR signal to the average non-IR signal.

2. The method of claim 1 wherein averaging the plurality of IR light signals comprises averaging with pixels covered by both green and red filters and with pixels covered by both green and blue filters.

3. The method of claim 1 wherein normalizing utilizes a plurality of red, green, and blue gains.

4. The method of claim 3 wherein the plurality of red, green, and blue gains are applied to the plurality of IR light signals.

5. The method of claim 1 wherein the plurality of IR light signals are read from pixels under a filter that filters out all but IR light.

6. The method of claim 5 wherein the plurality of non-IR light signals are read from pixels that are separated by barrier pixels from the pixels under the filter that filters out all but IR light.

7. A method for detecting infrared light on a semiconductor image sensor having a plurality of optically black IR-sensitive pixels that are substantially adjacent to a matrix of active pixels shielded with an infrared filter, the matrix of active pixels having red, green, and blue pixels, the method comprising:
   reading first signals from the optically black IR-sensitive pixels;
   averaging and normalizing the first signals;
   reading second signals from the matrix of active pixels, the second signals being read from active pixels that are substantially adjacent to the optically black IR-sensitive pixels;
   averaging and normalizing the second signals; and
   generating a ratio of the averaged and normalized first signals to the average and normalized second signals.

8. The method of claim 7 wherein the second signals are averaged in response to an average of infrared received by the red pixels, an average of infrared received by the blue pixels, and an average of infrared received by the green pixels.

9. The method of claim 7 wherein the ratio is an indication of an amount of IR illumination on the image sensor.

10. The method of claim 7 wherein the plurality of optically black IR sensitive pixels are formed in a border around the matrix of active pixels.

11. The method of claim 7 wherein averaging and normalizing the first signals comprises averaging and normalizing by analog gains.

12. The method of claim 11 wherein averaging the first signals comprises generating $G_{avg}$ by $(avg(P_{ij}green1)/GainG1 + avg(P_{ij}green2)/GainG2)/2/T_{int\ activepixels}$ where '$P_{ij}$ green1' is a light signal from a pixel located in row i and column j in the matrix of active pixels, covered by a green filter and located in such rows i that contain pixels covered with green and red filters, '$P_{ij}$ green2' is a light signal from a pixel located in row i and column j in the matrix of active pixels, covered by a green filter and located in such rows i that contain pixels covered with green and blue filters, 'GainG1' is a gain applied to the green 1 pixels, 'GainG2' is a gain applied to the green2 pixels, and '$T_{int\ activepixels}$' is an integration time that the active pixels are receiving light.

13. The method of claim 12 wherein normalizing the first signals comprises applying gains GainR, GainB, GainG1, and GainG2 to corresponding pixels in a Bayer pattern.

14. The method of claim 13 wherein the gains GainR, GainB, GainG1, and GainG2 are applied to the plurality of optically black IR sensitive pixels.

15. A method for detecting infrared light on a semiconductor image sensor having an array of active pixels filtered by an infrared filter and an area of optically black infrared-sensitive pixels that are filtered against visible light, the method comprising:
   reading signals from the optically black infrared-sensitive pixels;
   determining if the optically black infrared-sensitive pixel signals indicate infrared illumination of the optically black infrared-sensitive pixels;
   if infrared illumination is present, comparing signals from adjacent active pixels that are adjacent to the area of optically black infrared-sensitive pixels to determine a level of infrared illumination on the image sensor.

16. The method of claim 15 wherein the area of optically black infrared-sensitive pixels substantially encircle a periphery of the array of active pixels.

17. The method of claim 15 wherein determining if the optically black infrared-sensitive pixel light signals indicate illumination includes:
   comparing the optically black infrared-sensitive pixel light signals to a predetermined threshold; and
   if the optically black infrared-sensitive pixel light signals are greater than the predetermined threshold, infrared illumination is present.

18. The method of claim 15 wherein a ratio of the light signals from the adjacent active pixels to the adjacent optically black infrared-sensitive pixels indicates an amount of infrared illumination on the image sensor.

19. The method of claim 15 wherein the optically black infrared-sensitive pixels are covered by a black filter.

20. The method of claim 15 wherein reading signals from the optically black infrared-sensitive pixels comprises:
   zeroing a row counter prior to reading; and
   incrementing the row counter during reading.

\* \* \* \* \*

UNITED STATES PATENT AND TRADEMARK OFFICE
CERTIFICATE OF CORRECTION

| | | |
|---|---|---|
| PATENT NO. | : 8,569,681 B2 | Page 1 of 1 |
| APPLICATION NO. | : 12/813705 | |
| DATED | : October 29, 2013 | |
| INVENTOR(S) | : Ilia Ovsiannikov et al. | |

It is certified that error appears in the above-identified patent and that said Letters Patent is hereby corrected as shown below:

In the Claims:

In column 8, line 30, in Claim 12, delete "green 1" and insert -- green1 --, therefor.

Signed and Sealed this
Twenty-eighth Day of January, 2014

Michelle K. Lee
*Deputy Director of the United States Patent and Trademark Office*